(12) United States Patent
Yoshimura

(10) Patent No.: US 6,707,319 B2
(45) Date of Patent: Mar. 16, 2004

(54) FREQUENCY COMPARATOR WITH MALFUNCTION REDUCED AND PHASE-LOCKED STATE DETECTING CIRCUIT USING THE SAME

(75) Inventor: Tsutomu Yoshimura, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/327,864

(22) Filed: Dec. 26, 2002

(65) Prior Publication Data

US 2003/0179014 A1 Sep. 25, 2003

(30) Foreign Application Priority Data

Mar. 19, 2002 (JP) .......................... 2002-076670

(51) Int. Cl.⁷ .......................... G01R 25/00; H03D 13/00
(52) U.S. Cl. .......................... 327/12; 327/43
(58) Field of Search .......................... 327/2, 3, 8, 12, 327/26, 36–44, 46–49, 141, 160, 163, 205

(56) References Cited

U.S. PATENT DOCUMENTS

| | | | | |
|---|---|---|---|---|
| 5,619,148 A | * | 4/1997 | Guo .............................. | 327/3 |
| 5,652,531 A | * | 7/1997 | Co et al. ..................... | 327/12 |
| 5,789,947 A | * | 8/1998 | Sato .............................. | 327/3 |
| 5,963,059 A | * | 10/1999 | Partovi et al. ................ | 327/12 |
| 6,466,058 B1 | * | 10/2002 | Goldman ..................... | 327/49 |
| 6,614,314 B2 | * | 9/2003 | d'Haene et al. ............. | 331/1 A |

FOREIGN PATENT DOCUMENTS

JP 08-292386 11/1996

OTHER PUBLICATIONS

"A Versatile Clock Recovery Architecture and Monolithic Implementation", Lawrence M. DeVito, "Monolithic Phase–Locked Loops and Clock Recovery Circuits", 1996, pp. 405–420.

* cited by examiner

*Primary Examiner*—My-Trang Nu Ton
(74) *Attorney, Agent, or Firm*—McDermott, Will & Emery

(57) ABSTRACT

A frequency comparator detects the phase of a data signal DATA by using four-phase clocks ICLK, /ICLK, QCLK and /QCLK as a reference and detects a change in the phase. A counting processing unit counts a period in which a control signal UP2 or DN2 is activated within a predetermined period, and outputs an overflow detection signal LOL2 if the frequency is high. A hysteresis generating unit changes a signal LOL to the L level only after signal LOL goes low X times consecutively. On the other hand, after signal LOL is set to the L level once, the hysteresis generating unit changes signal LOL to the H level only after signal LOL2 goes high X times consecutively. With such a configuration, a phase-locked state detecting circuit with reduced malfunction even when a data signal having larger jitter is input can be provided.

13 Claims, 18 Drawing Sheets

| S | R | Q |
|---|---|---|
| H | H | THE PREVIOUS VALUE |
| H | L | H |
| L | H | L |
| L | L | — |

US 6,707,319 B2

FREQUENCY COMPARATOR WITH MALFUNCTION REDUCED AND PHASE-LOCKED STATE DETECTING CIRCUIT USING THE SAME

BACKGROUND OF THE INVENTION

1. Field of the Invention

The present invention relates to a frequency comparator with a malfunction reduced at the time of performing frequency comparison on a data signal having large jitter, and a phase-locked state detecting circuit using the same.

2. Description of the Background Art

A circuit for comparing the frequency of an input signal from the outside of a chip with the frequency of an internal clock generated by an internal oscillator is called a frequency comparator. The frequency comparator outputs a control signal DOWN when the frequency of the internal clock is high and outputs a control signal UP when the frequency of the internal clock is low. The frequency comparator is used for a control of optimizing the frequency of the internal oscillator with respect to a signal input from the outside.

FIG. 16 is a circuit diagram showing the configuration of a conventional frequency comparator 500.

Referring to FIG. 16, frequency comparator 500 is the same circuit as that described in a reference of Lawrence M. DeVito "A Versatile Clock Recovery Architecture and Monolithic Implementation", pp. 405–420, Monolithic Phase Locked-Loops and Clock Recovery Circuits, edited by B. Razavi, IEEE Press. Frequency comparator 500, shown in FIG. 14 of the reference, compares input data with four clocks of phases which are different from each other by 90°, and outputs control signal UP or DOWN.

FIG. 17 is a diagram for explaining the operation of frequency comparator 500 of FIG. 16.

Referring to FIG. 17, phases of rising edges of four-phase clocks are set to 0°, 90°, 180° and 270°, and a change point (hereinafter, also referred to as a data edge) of an input data signal DATA in a phase with respect to the clock is expressed by a position on a circle graph of 0° to 360°. A region in which the phase of the data edge lies in a range from 0° to 90° will be called a region A. A region in which the phase of the data edge lies in a range from 90° to 180° will be called a region B. A region in which the phase of the data edge lies in a range from 180° to 270° will be called a region C. A region in which the phase of the data edge lies in a range from 270° to 360° will be called a region D.

When the edge of data signal DATA changes from region B to region C within one clock, frequency comparator 500 outputs control signal DOWN.

On the contrary, when the edge of data signal DATA changes from region C to region B within one clock, frequency comparator 500 outputs control signal UP.

When the edge of data signal DATA is in region A or D, frequency comparator 500 outputs nothing.

When the phase of the data signal and that of the clock are the same, that is, in a phase-locked state, it can be considered that the edge of the data signal is in region A or D. In this state, the frequency comparator does not output control signals UP and DOWN, and it is considered that, in a clock recovery circuit which receives the control signal and determines the clock frequency, the condition of a constant frequency is maintained.

However, generally, fluctuations in timing, called jitter, at which data is switched exists in a data signal. Ideally, the data edge is positioned at 0° on the graph of FIG. 17. However, in the case where jitter is ±90° or larger with respect to, for example, the phase of the clock, even in the phase-locked state, there is the possibility that the data edge is positioned in the region B or C. In such a case, it is feared that, depending on the condition, control signal UP or DOWN is erroneously output.

FIG. 18 is an operation waveform chart for explaining the state where jitter exists in data signal DATA.

Referring to FIG. 18, the rising edge of a clock signal ICLK is 0° and a clock signal QCLK rises behind the rising edge by the phase of 90°. Reference characters A, B, C, and D correspond to the regions A, B, C, and D of FIG. 17, respectively.

When data signal DATA is overwritten in certain cycles, an eye pattern is obtained. In the eye pattern in the phase-locked state, fluctuations in waveform due to jitter exist around the border between the regions D and A.

The waveform of one of data signals DATA having large jitter is shown below the eye pattern. Ideally, data signal DATA rises at time t1 and falls at time t4. However, due to the large jitter, the rising edge of data signal DATA exists in region B after time t2, and the following falling edge exists in region C before time t3.

In such a case, since the data edge changes from region B to region C at time t3, a phase E11 changes to a phase E12 in FIG. 17, and frequency comparator 500 outputs control signal DOWN.

FIG. 19 is an operation waveform chart showing another case of erroneous operation.

FIG. 19 shows a case that when a data signal and a clock signal are phase-locked with a predetermined phase offset at two input nodes of a frequency comparator, for example, an average edge of the data signals lies in region C. In such a case, when the edge of data signal DATA in the following cycle lies in region B due to jitter, control signal UP is output. That is, the rising edge of data signal DATA at time t1 is sampled in region C, and the falling edge of data signal DATA is sampled in region B at time t2. In such a case, control signal UP is output.

In conventional frequency comparator 500 the control signal is output in the case where the jitter of data signal DATA is large. Although an average clock frequency and an average data cycle are equal to each other, the control signal is output when the edge of data signal DATA instantaneously lies not in an inherently expected position.

Therefore, such an error of the frequency comparator with respect to a data signal having large jitter has to be solved.

SUMMARY OF THE INVENTION

An object of the invention is to provide a frequency comparator with a malfunction reduced in the case where a data signal having large jitter is compared with a clock signal, and a phase-locked state detecting circuit using the same.

The present invention provides, in short, a frequency comparator for comparing a clock frequency with a frequency of a data signal by using first to fourth clock signals having an equal clock frequency and of which respective phases of reference edges are at 0°, 90°, 180° and 270°, includes: first and second detectors; and a phase change detector.

The first detector receives the data signal synchronously with the first and third clock signals and detects whether or not a phase of a signal transition point of the data signal lies with respect to the clock signal in a range from 0° to 180°. The second detector receives the data signal synchronously with the second and fourth clock signals and detects whether or not a phase of the signal transition point lies with respect to the clock signal in a range from 90° to 270°. The phase change detector receives outputs of the first and second detectors, detects a change in the phase of the signal transition point with respect to the clock signal, and outputs a result of comparison between the clock frequency and the frequency of the data signal.

According to another aspect of the invention, there is provided a phase-locked state detecting circuit for detecting a phase-locked state of a clock and a data signal and outputting a phase-locked state detection signal, includes; a frequency comparator; a counting processing unit; and a hysteresis generating unit.

The frequency comparator compares a clock frequency with a frequency of the data signal, and activates a control signal when the frequencies are different from each other. The counting processing unit counts an activate period of the control signal per predetermined period on the basis of the clock, and outputs an overflow detection signal when a count value exceeds a predetermined number. The hysteresis generating unit makes the phase-locked state detection signal inactive when the overflow detection signal is activated a predetermined number of times consecutively after the phase-locked state detection signal is activated, and activates the phase-locked state detection signal when the overflow detection signal is made inactive a predetermined number of times consecutively after the phase-locked state detection signal is made inactive.

Therefore, since data latched synchronously with the clock signal by the flip flop at the first stage is used as a clock for the flip flop at the following stage, a main advantage of the invention is that the frequency of a change in internal data is low, power consumption can be reduced, and designing of timings is facilitated.

Another advantage of the invention is that, even when a data signal having large jitter is input, it is not immediately recognized that the phase lock is lost, so that an erroneous determination can be avoided when the average clock frequency and the average frequency of the data signal coincide with each other.

The foregoing and other objects, features, aspects and advantages of the present invention will become more apparent from the following detailed description of the present invention when taken in conjunction with the accompanying drawings.

DESCRIPTION OF PREFERRED EMBODIMENTS

Figure 1:
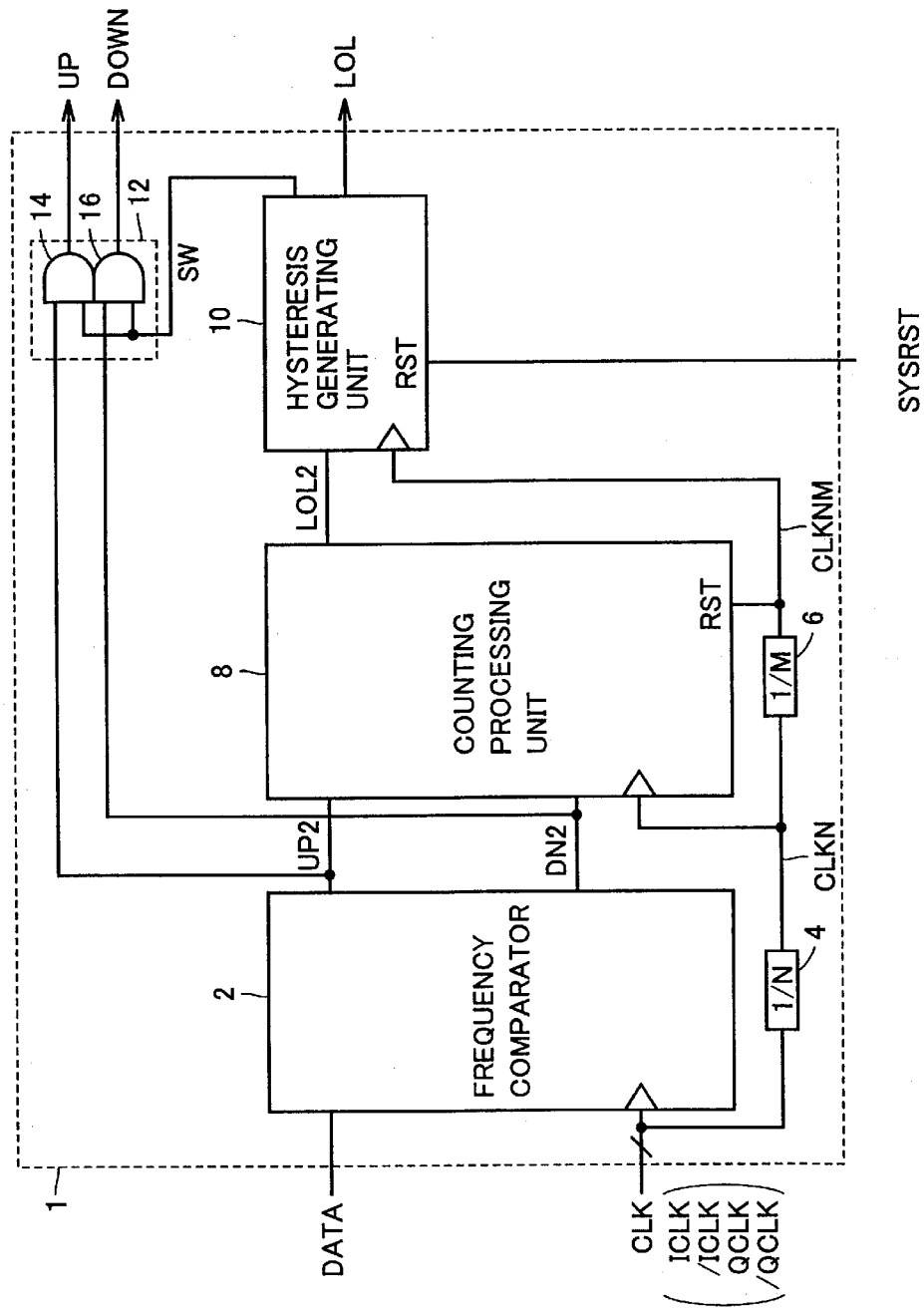
FIG. 1 is a schematic block diagram showing the configuration of a phase-locked state detecting circuit 1 in an embodiment of the invention.

An embodiment of the invention will be described in detail hereinafter with reference to the drawings. The same reference numeral in the drawings denotes the same or corresponding component.

FIG. 1 is a schematic block diagram showing the configuration of a phase-locked state detecting circuit 1 in the embodiment of the invention.

Referring to FIG. 1, phase-locked state detecting circuit 1 includes: a frequency comparator 2 for comparing the phase of a clock signal CLK of four phases which are different from each other by 90° with that of a data signal DATA and outputting a control signal UP2 or DN2; a counting processing unit 8 for counting up control signals UP2 and DN2 and detecting an overflow of a predetermined count value; a frequency dividing unit 4 for dividing clock signal CLKN to 1/N, thereby outputting a clock signal CLKN; a frequency dividing unit 6 for further dividing clock signal CLKN to 1/M, thereby outputting a clock signal CLKNM; a hysteresis generating unit 10 for making a signal LOL2 indicative of the result of overflow display hysteresis and outputting signals LOL and SW; and an output gate circuit 12 for outputting control signal UP2 or DN2 as control signal UP or DOWN in accordance with signal SW.

Output gate circuit 12 includes an AND circuit 14 for receiving control signal UP2 and signal SW and outputting control signal UP, and an AND circuit 16 for receiving control signal DN2 and signal SW and outputting control signal DOWN.

Clock signal CLK includes clock signals ICLK and QCLK of phases different from each other by 90° and clock signals /ICLK and /QCLK as inversion clocks of clock signals ICLK and QCLK.

As described above, an output of frequency comparator 2 may be erroneous when data signal DATA of large jitter is input. Therefore, counting processing unit 8 counts up control signals UP2 and DN2 output from frequency comparator 2 by an n-bit binary counter which will be described hereinlater. The counter is cleared periodically (every M cycles) and starts counting-up operation again from zero. With such a configuration, when the value to be counted up within M-cycle period becomes the n-th power of 2 or larger, an overflow is detected and signal LOL2 is activated to the H level.

Hysteresis generating unit 10 observes signal LOL2 every M×N cycles. Only after signal LOL2 is activated several times consecutively, signal LOL is output. Signal LOL is a signal indicative of loss of lock.

On the contrary, only after signal LOL2 is made inactive in successive plural cycles since signal LOL is activated once, hysteresis generating unit 10 makes signal LOL inactive (L level). By making signal LOL display such hysteresis, signal LOL is prevented from erroneously going high or low.

Signal SW goes high only after signal LOL2 is activated in some successive cycles. That is, signal SW goes high for the first time under condition that control signal UP2 or DN2 is activated sufficiently in some successive cycles and, as a result, control signal UP or DOWN is output.

Figure 2:
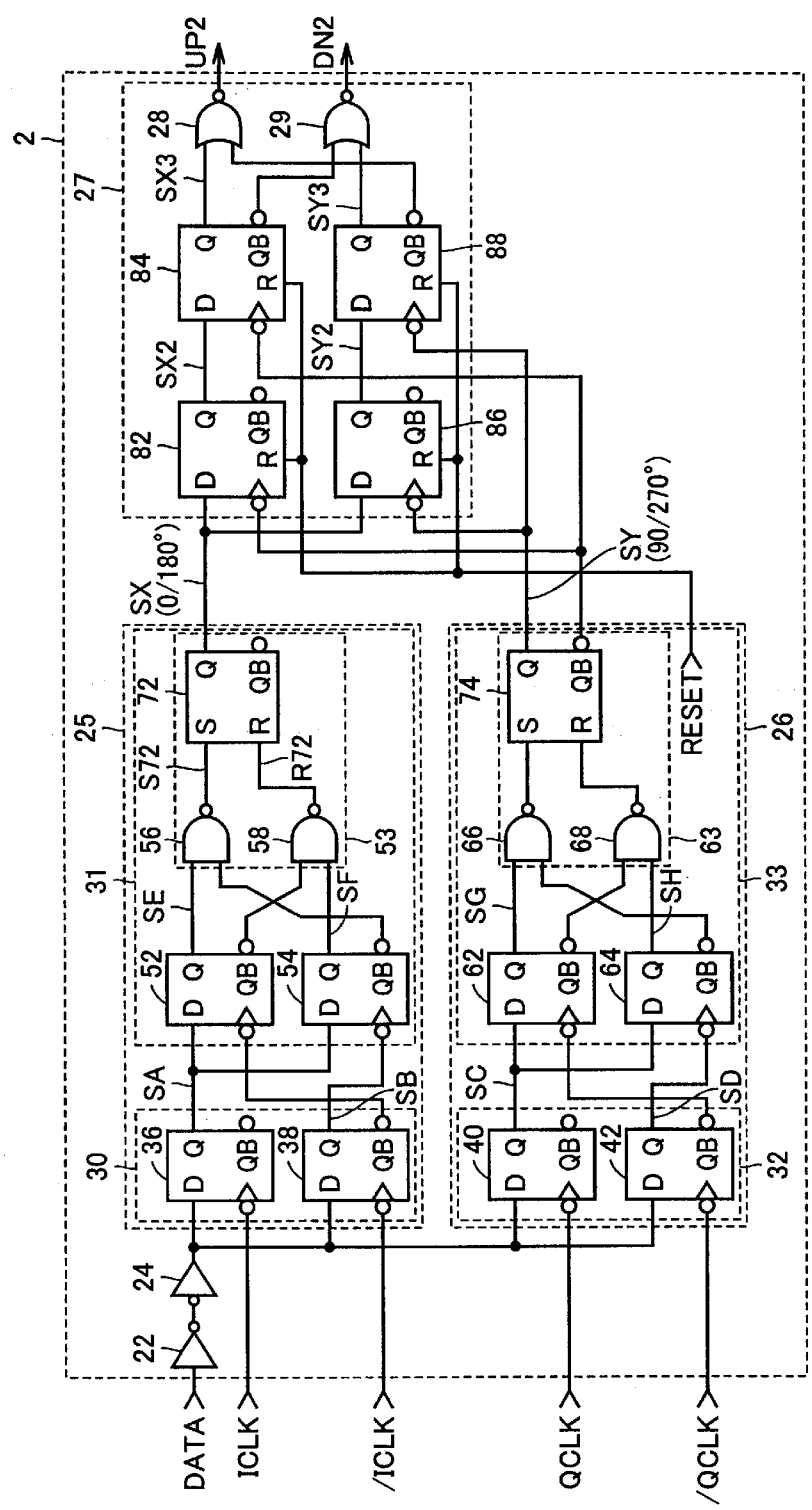
FIG. 2 is a circuit diagram showing the configuration of a frequency comparator 2 in FIG. 1.

FIG. 2 is a circuit diagram showing the configuration of frequency comparator 2 in FIG. 1.

Referring to FIG. 2, frequency comparator 2 includes an inverter 22 for receiving and inverting data signal DATA, an inverter 24 for receiving and inverting an output of inverter 22, a detector 25 for determining whether or not the edge of an output signal of inverter 24 exists in the range from 0° to 180° on the basis of clock signals ICLK and /ICLK, a detector 26 for detecting whether or not the edge of an output signal of inverter 24 exists in the range from 90° to 270°, and a phase change detector 27 for determining how the phase of the edge of data signal DATA changes in accordance with signal SX output from detector 25 and signal SY output from detector 26 and outputting control signal UP2 or DN2.

Detector 25 includes: a data latch 30 for latching an output of inverter 24 at high speed synchronously with clock signals ICLK and /ICLK and outputting signals SA and SB; and a data latch 31 for latching signal SA in response to signal SB.

Data latch 30 includes D flip flops 36 and 38. D flip flops 36 and 38 are D flip flops for latching data at the falling edge of a clock signal and outputting complementary signals Q and QB.

D flip flop 36 receives an output of inverter 24 by its input D, receives clock signal ICLK by its clock input node, and outputs signal SA from its output Q.

D flip flop 38 receives an output of inverter 24 by its input D, receives clock signal /ICLK by its clock input node, outputs signal SB from its output Q, and outputs an inversion signal of signal SB from its output QB.

Data latch 31 includes D flip flops 52 and 54 for latching data at the falling edge of a signal supplied to a clock input node and outputting complementary outputs Q and QB, and a phase determining unit 53 for determining whether or not the phase of a data edge lies in the range from 90° to 180° in accordance with the data held in D flip flops 52 and 54.

Phase determining unit 53 includes NAND circuits 56 and 58 and an SR flip flop 72 which is set/reset in accordance with outputs of NAND circuits 56 and 58.

D flip flop 52 receives signal SA by its input D, receives a signal from output QB of D flip flop 38 by its clock input node, and outputs signal SE from its output Q.

D flip flop 54 receives signal SA by its input D, receives signal SB by its clock input node, and outputs signal SF from its output Q.

NAND circuit 56 receives signal SE and a signal from output QB of D flip flop 54 as an inversion output of signal SF. NAND circuit 58 receives signal SF and a signal from output QB of D flip flop 52 as an inversion signal of signal SE. An output of NAND circuit 56 is supplied to the "set" input of SR flip flop 72. An output of NAND circuit 58 is supplied to the "reset" input of SR flip flop 72. A signal SX is output from output Q of SR flip flop 72.

Detector 26 includes a data latch 32 for latching an output of inverter 24 at high speed synchronously with clock signals ICLK and /ICLK and outputting signals SC and SD, and a data latch 33 for latching signal SC in accordance with signal SD.

Data latch 32 includes D flip flops 40 and 42. D flip flops 40 and 42 are D flip flops for latching data at the falling edge of a clock signal and outputting complementary outputs Q and QB as signals.

D flip flop 40 receives an output of inverter 24 by its input D, receives clock signal ICLK by its clock input node, and outputs signal SC from its output Q.

D flip flop 42 receives an output of inverter 24 by its input D, receives clock signal /ICLK by its clock input node, outputs signal SD from its output Q, and outputs an inversion signal of signal SD from its output QB.

Data latch 33 includes D flip flops 62 and 64 each for latching data at the falling edge of a signal supplied to the clock input node and outputting complementary signals from its outputs Q and QB, and a phase determining unit 63 for determining whether or not the phase of the data edge lies in the range from 90° to 270° in accordance with data held in D flip flops 62 and 64.

Phase determining unit 63 includes NAND circuits 66 and 68 and an SR flip flop 74 which is set/reset in accordance with outputs of NAND circuits 66 and 68.

D flip flop 62 receives signal SC by its input D, receives a signal from output QB of D flip flop 42 by its clock input node, and outputs signal SG from its output Q.

D flip flop 64 receives signal SC by its input D, receives signal SD by its clock input node, and outputs a signal SH from its output Q.

NAND circuit 66 receives a signal SG and a signal from output QB of D flip flop 64 as an inversion output of signal SH. NAND circuit 68 receives signal SH and a signal from output QB of D flip flop 62 as an inversion signal of signal SG. An output of NAND circuit 66 is supplied to the "set" input of SR flip flop 74. An output of NAND circuit 68 is supplied to the "reset" input of SR flip flop 74. A signal SY is output from output Q of SR flip flop 74.

Phase change detector 27 includes D flip flops 82 to 88 each with a reset input, for latching data at the falling edge of a clock and outputting complementary outputs Q and QB, and NOR circuits 28 and 29.

D flip flop 82 receives signal SX by its input D, receives a signal from output QB of SR flip flop 74 by its clock input node, receives a signal RESET by its reset input, and outputs signal SX2 from output Q. D flip flop 84 receives signal SX2 by its input D, receives a signal from output QB of SR flip flop 74 by its clock input node, receives signal RESET by its reset input, and outputs a signal SX3 from output Q.

D flip flop 86 receives signal SX by its input D, receives signal SY by its clock input node, receives signal RESET by its reset input, and outputs a signal SY2 from its output Q.

D flip flop 88 receives signal SY2 by its input D, receives signal SY by its clock input node, receives signal RESET by its reset input, and outputs a signal SY3 from its output Q.

NOR circuit 28 receives a signal SX3 and a signal from output QB of D flip flop 88 as an inversion signal of signal SY3, and outputs control signal UP2. NOR circuit 29 receives signal SY3 and a signal from output QB of D flip flop 84 as an inversion signal of signal SX3, and outputs control signal DN2.

Figure 3:
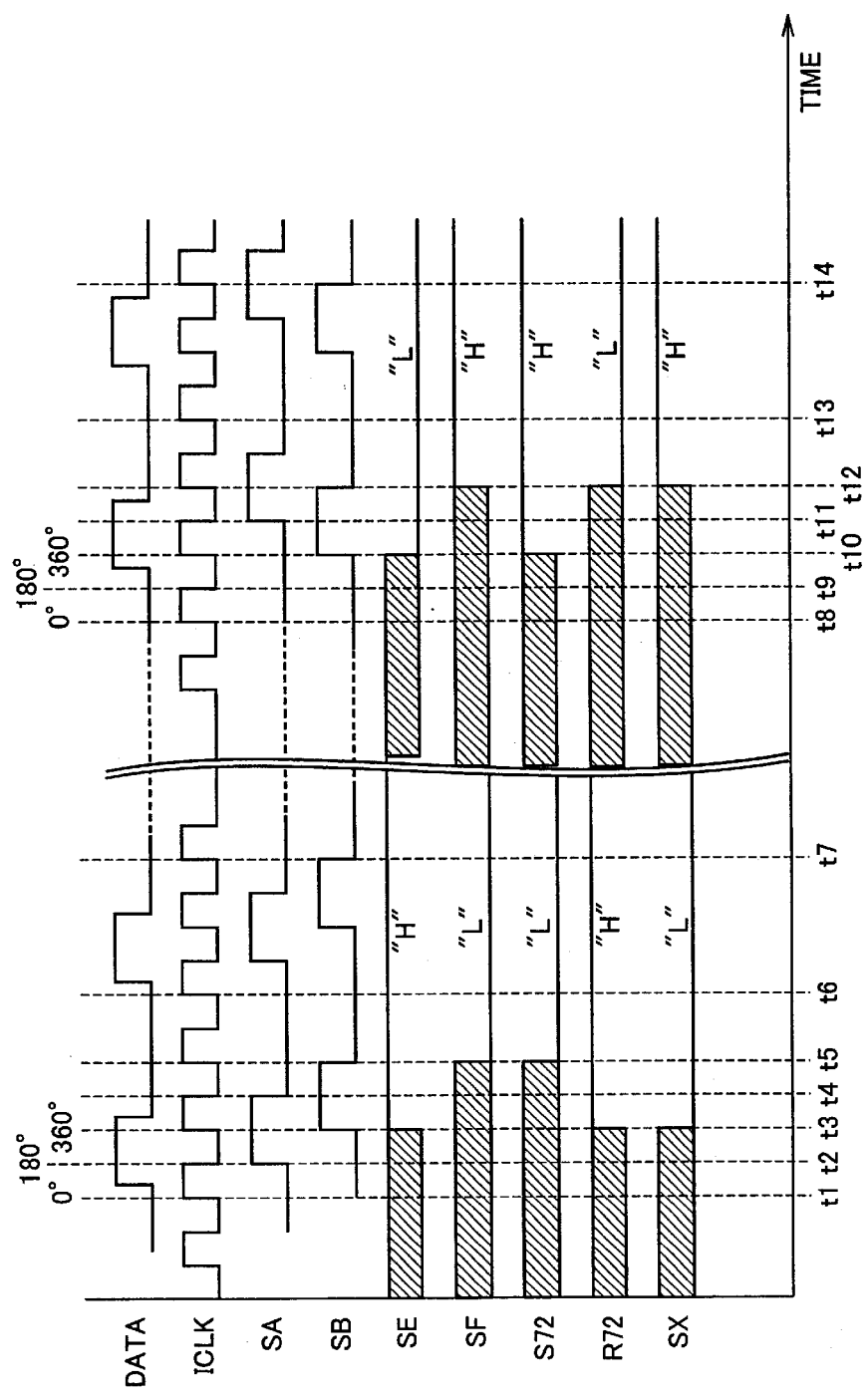
FIG. 3 is an operation waveform chart for explaining the operation of a detector 25 in FIG. 2.

FIG. 3 is an operation waveform chart for explaining the operation of detector 25 in FIG. 2.

Referring to FIGS. 2 and 3, the edge of data signal DATA exists in the range of the phase from 0° to 180° at time t1 to t7 and exists in the range of the phase from 180° to 360° at time t9 to t14.

The rising edge of clock signal ICLK at time t1 shows the phase of 0°. The falling edge of clock signal ICLK at time t2 shows the phase of 180°. The rising edge of clock signal ICLK at time t3 shows the phase of 360°.

At the rising edge of clock signal ICLK at time t, that is, at the falling edge of clock signal /ICLK, data signal DATA is latched by D flip flop 38 and signal SB is determined at the L level.

At the falling edge of clock signal ICLK at time t2, data signal DATA is latched by D flip flop 36, and signal SA changes from the L level to the H level. At time t3, D flip flop 38 latches data signal DATA and signal SB changes from the L level to the H level.

Since D flip flop 52 latches data at the falling edge of the inversion signal of signal SB when signal SB rises, at time t, signal SA is latched and signal SE is determined at the H level. When signal SE goes high, an output of NAND circuit 58 to which the inversion signal of signal SE is supplied goes high, SR flip flop 72 is reset, and signal SX goes low.

Subsequently, signal SA goes low at time t4 and signal SB goes low at time t5. After time t5, signal SE is determined at the H level and signal SF is determined at the L level. A set signal S72 of SR flip flop 72 is determined at the L level, and a reset signal R72 is determined at the H level. Therefore, when the edge of data signal DATA exists in the range of the phase from 0° to 180°, signal SX goes low.

Since operations during time t6 to t7 are similar to those from t1 to t5, description of the operations will not be repeated.

A case where the phase of data signal DATA exists in the range from 180° to 360° will now be described.

Signal SB goes low at time t8, and signal SA goes low at time t9.

When signal SB changes from the L level to the H level at time t10, signal SE is determined at the L level and, accordingly, set signal S72 is set at the H level. Signal SA changes from the L level to the H level at time t11 and signal SB changes from the H level to the L level at time t12.

At time t12, signal SF goes high and, accordingly, reset signal R72 is determined at the L level. As a result, SR flip flop 72 is set and signal SX goes high. During the period from time t13 and t14, the operations from time t8 to t12 are repeated.

As described above, during the period in which the phase of the data edge of data signal DATA lies in the range from 0° to 180°, signal SX is at the L level. On the other hand, while the phase of the data edge lies in the range from 180° to 360°, signal SX is at the H level.

Detector 26 performs similar operations synchronously with clock signal QCLK having a phase shifted from that of clock signal ICLK by 90°.

Figure 4:
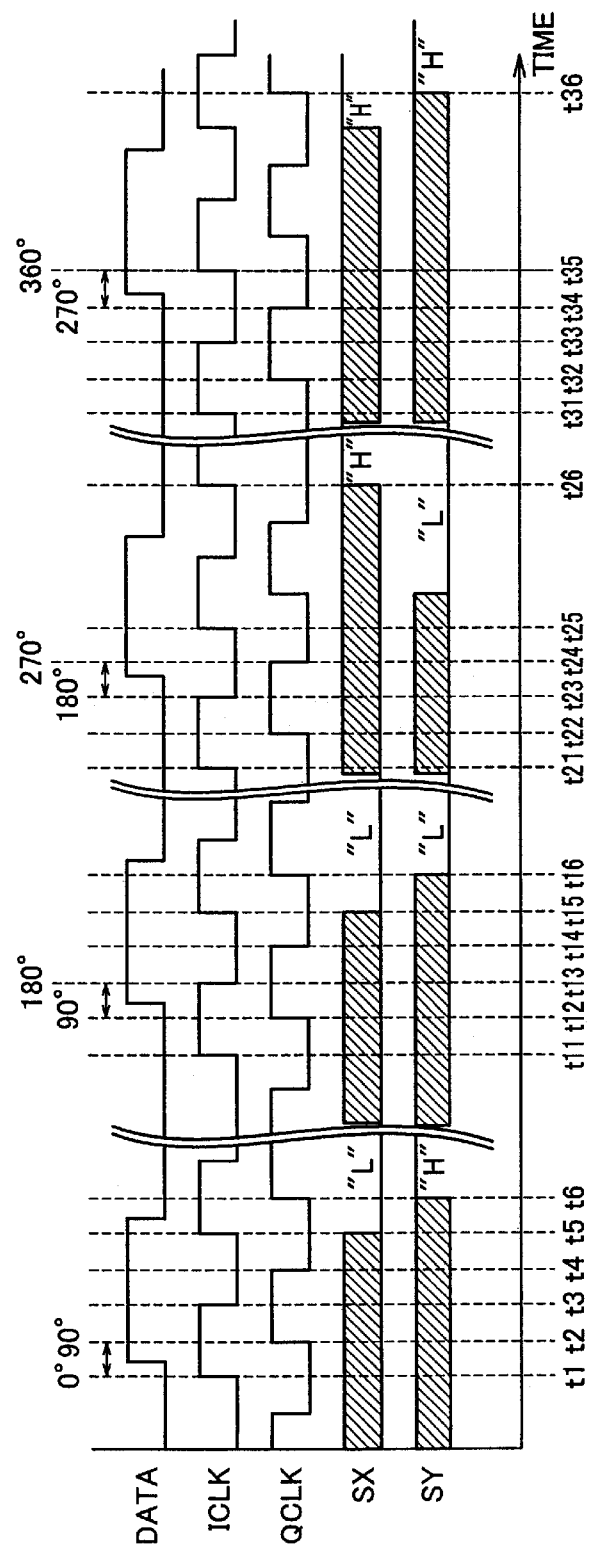
FIG. 4 is an operation waveform chart for explaining how signals SX and SY change according to the phase of an edge of a data signal DATA.

FIG. 4 is an operation waveform chart for explaining how signals SX and SY change according to the phase of the edge of data signal DATA.

Referring to FIG. 4, at times t1, t11, t21, and t31, the phase is 0°. At times t2, t12, t22, and t32, the phase is 90°. At times t3, t, t23, and t33, the phase is 180°. At times t4, t14, t24, and t34, the phase is 270°. Further, at times t5, t15, t25, and t35, the phase is 360°.

A case where the phase of the edge of data signal DATA lies in the range from 0° to 90° during the period from time t1 to t6 will be described. In this case, signal SX is determined at the L level at time t5, and signal SY is determined at the H level at time t6.

A case where the phase of the edge of data signal DATA lies in the range from 90° to 180° during the period from time t11 to t16 will be described. In this case, signal SX is determined at the L level at time t15, and signal SY is determined at the L level at time t16.

A case where the phase of the edge of data signal DATA lies in the range from 180° to 270° during the period from time t21 to t26 will be described. In this case, signal SX is determined at the H level at time t26 and signal SY is determined at the L level.

A case where the phase of the edge of data signal DATA lies in the range from 270° to 360° during the period from time t31 to t36 will be described. In this case, both signals SX and SY are determined at the H level at time t36.

As described above, according to a combination of signals SX and SY, the position in which the data edge exists is indicated.

Figure 5:
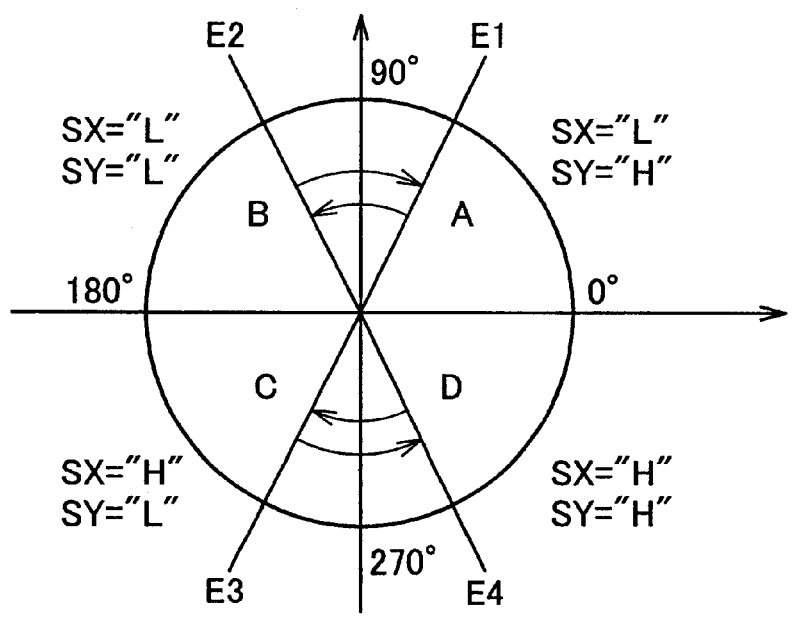
FIG. 5 is a diagram for explaining the operation of a phase change detector 27 in FIG. 2.

FIG. 5 is a diagram for explaining the operation of phase change detector 27 in FIG. 2.

Referring to FIGS. 2 and 5, the position of the phase of the edge of the data signal DATA in the range of region A, B, C, or D is known according to signals SX and SY output from detectors 25 and 26.

Specifically, when the phase of data signal DATA exists in region A, signal SX="L", and signal SY="H". When the edge exists in region B, signal SX="L", and signal SY="L".

When the edge exists in region C, SX="H", and SY="L". When the edge exists in region D, SX="H", and SY="H".

Since each of D flip flops 82 and 84 receives an inversion signal of signal SY by its clock input node, when signal SY changes from the L level to the H level, the D flip flop latches an input signal. If signal SX latched at this time is at the L level, the phase of the data edge changes from a position E2 to a position E1.

On the contrary, if latched signal SX is at the H level, the phase of the data edge changes from a position E3 to a position E4. Therefore, if signal SX3 is at the H level, it means that the change in phase from E3 to E4 is detected.

Each of D flip flops 86 and 88 latches data at the falling edge of signal SY. If signal SX latched is at the L level, it means that the phase changes from E1 to E2. On the contrary, when latched signal SX is at the H level, it means that the phase changes from E4 to E3. Therefore, if signal SY3 is at the H level, it means that the change in phase from E4 to E3 is detected.

It is detected in NOR circuit 28 that signal SX3 is at the L level and signal SY3 is at the H level. At this time, it is determined that the cycle of data signal DATA is longer than that of the clock signal, and control signal UP2 is activated to the H level.

In NOR circuit 29, it is detected that signal SX3 is at the H level and signal SY3 is at the L level. In this case, it is determined that the cycle of data signal DATA is shorter than that of the clock signal, and control signal DN2 is activated to the H level.

Figure 6:
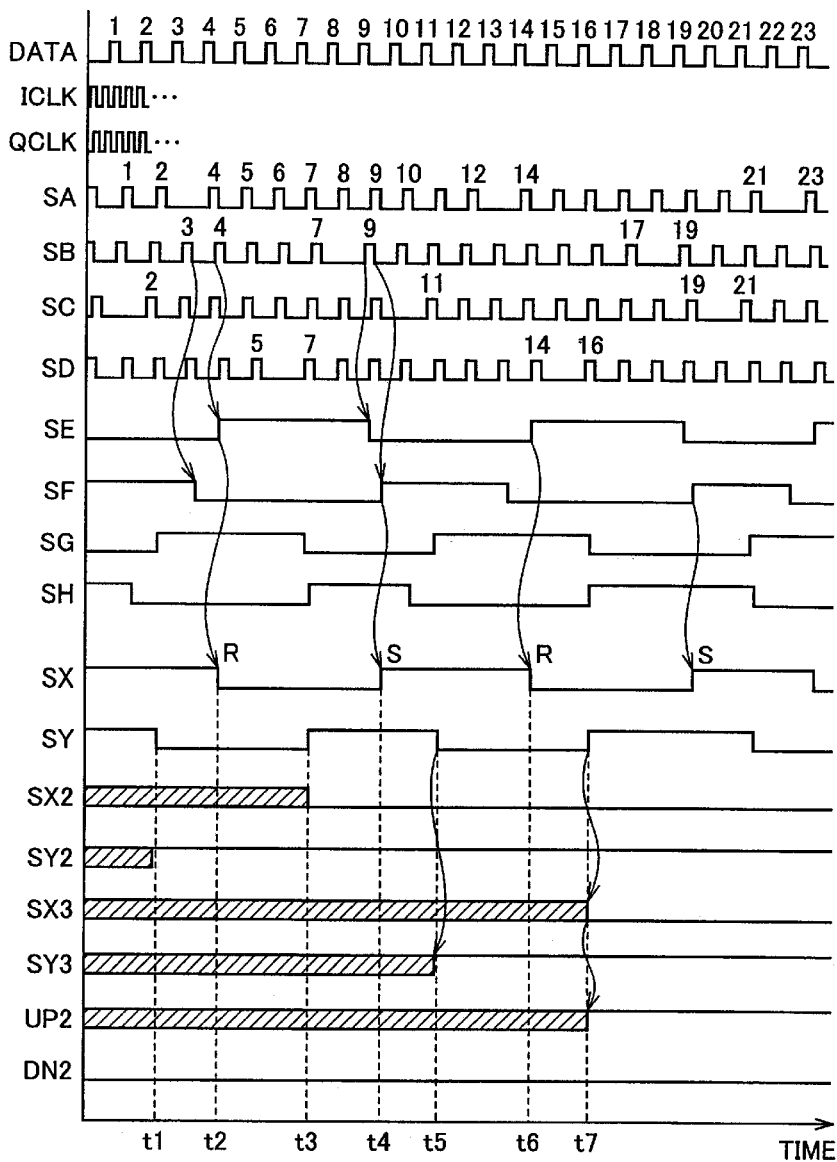
FIG. 6 is an operation waveform chart showing a case where the phase of data signal DATA gradually moves ahead with respect to a clock signal.

FIG. 6 is an operation waveform chart showing the case where the phase of data signal DATA gradually advances with respect to the clock signal.

Referring to FIGS. 2 and 6, as data signal DATA, L level data of twice and H level data of once are repeated. Since the cycle of one data is shorter than the clock cycle, there is a case such that D flip flops 36, 38, 40 and 42 at the first stage cannot latch H level data.

Signal SA shows a state where the 3rd, 13th, and 22nd H level data are not latched. Signal SB shows a state where the 8th and 18th H level data are not latched. Signal SC shows a state where 1st, 10th, and 20th H level data are not latched. Signal SD shows a state where the 6th and 15th data are not latched.

It is understood that the relation of phases of signals SA and SB before and after data which is not latched is reversed. Concretely, the seventh H level data of signal SA appears earlier than that of signal SB, but the ninth H level data of signal SB appears earlier than that of signal SA.

In response to the change of the phase, signals SE and SF change and, at time t4, signal SX changes from the L level to the H level. As a result of the change in the phase relations, at time t1, signal SY falls from the H level to the L level, and signal SY2 is determined at the H level.

Due to the change in the phase relations, at time t2, signal SX falls from the H level to the L level. At time t3, signal SY rises from the L level to the H level, and signal SX2 is determined at the L level. At time t4, signal SX rises from the L level to the H level. At time t5, signal SY falls from the H level to the L level, and signal SY3 is determined at the H level. At time t6, signal SX falls from the H level to the L level. At time t7, when signal SY rises from the L level to the H level, signal SX3 is determined at the L level, and control signal UP2 is accordingly determined at the H level.

As described above, in the case where the cycle of data signal DATA is shorter than the clock cycle, the frequency comparator activates control signal UP2 to the H level. When control signal UP is supplied to, for example, a circuit for generating a clock signal, the circuit for generating clock signals increases the oscillation frequency of the clock signal so that the cycle of the data signal and the clock cycle are adjusted.

Figure 7:
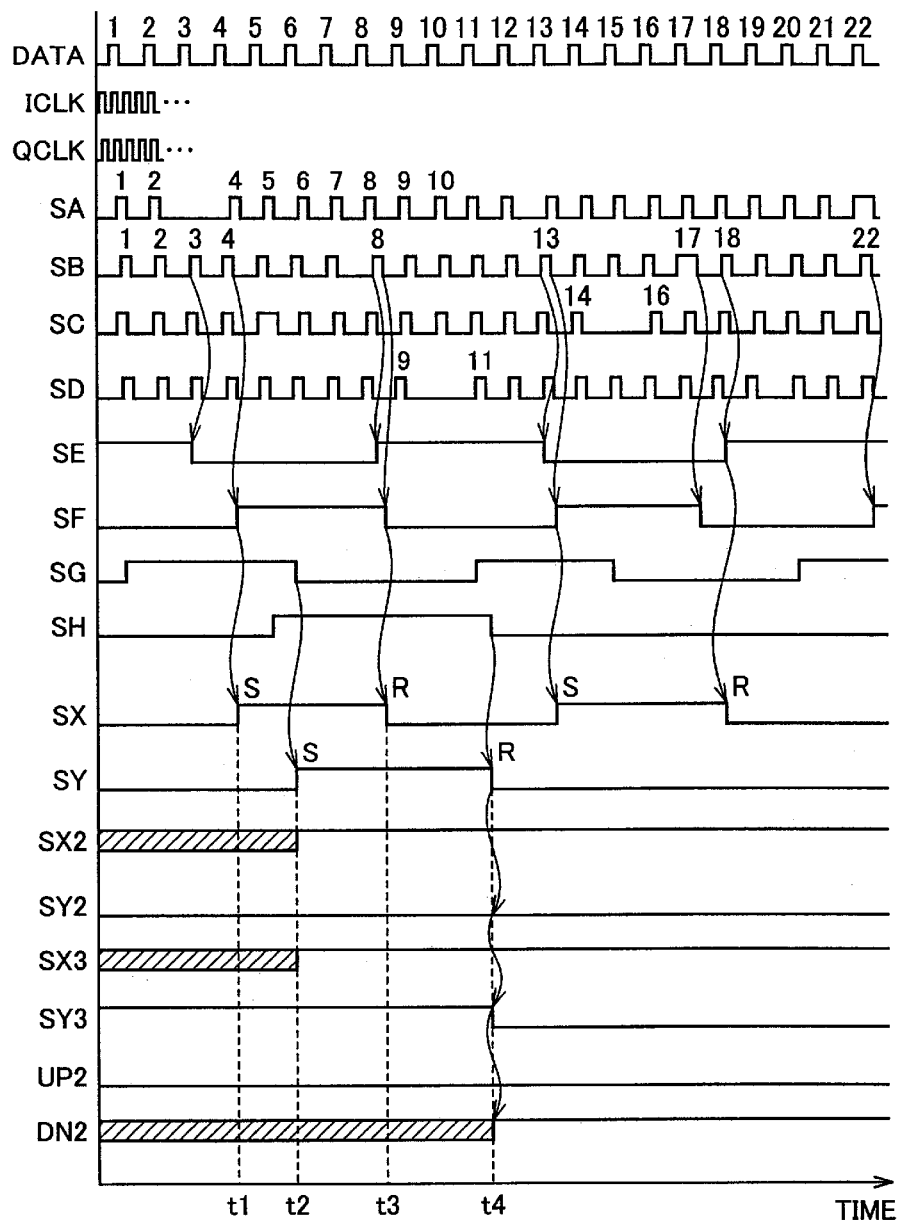
FIG. 7 is an operation waveform chart for explaining operation in the case where the cycle of data signal DATA is longer than a clock cycle.

FIG. 7 is an operation waveform chart for explaining the operation in the case where the cycle of data signal DATA is longer than the clock cycle.

When the cycle of data signal DATA is longer than the clock cycle, there is a case such that the edge of data signal DATA gradually shifts and H level data is not latched. On the contrary, there is also a case that H level data is latched twice consecutively.

Referring to FIGS. 2 and 7, signal SA shows a state that the third H level data is not latched and the 22nd H level data is latched twice consecutively. Signal SB shows a state that the 17th H level data is latched twice consecutively.

Signal SC shows a state that the fifth H level data is latched twice consecutively, and the 15th H level data is not latched. Signal SD shows a state that the tenth H level data is not latched.

According to the phase relations of signals SA to SH, signals SX and SY are determined.

At time t1, signal SX changes from the L level to the H level. At time t2, signal SY changes from the L level to the H level. Accordingly, signal SX is determined at the H level, and signal SX3 is determined at the H level.

At time t3, signal SX changes from the H level to the L level. At time t4, when signal SY changes from the H level to the L level, signal SY3 changes from the H level to the L level and, accordingly, control signal DN2 changes from the L level to the H level.

As described above, when the cycle of data signal DATA is longer than the clock cycle, control signal DN2 is set to the H level.

In the configuration of frequency comparator 2 as shown in FIG. 2, flip flops which latch data at the clock rate the same as the cycle of data signal DATA are only D flip flops 36, 38, 40, and 42 at the first stage.

Since each of D flip flops 52, 54, 62, 64, and 82 to 88 at the post stage uses output data of the first stage as a clock, its operation is low speed. With the configuration, the frequency of a data change is low, power consumption can be reduced, and designing of timings is facilitated.

Figure 8:
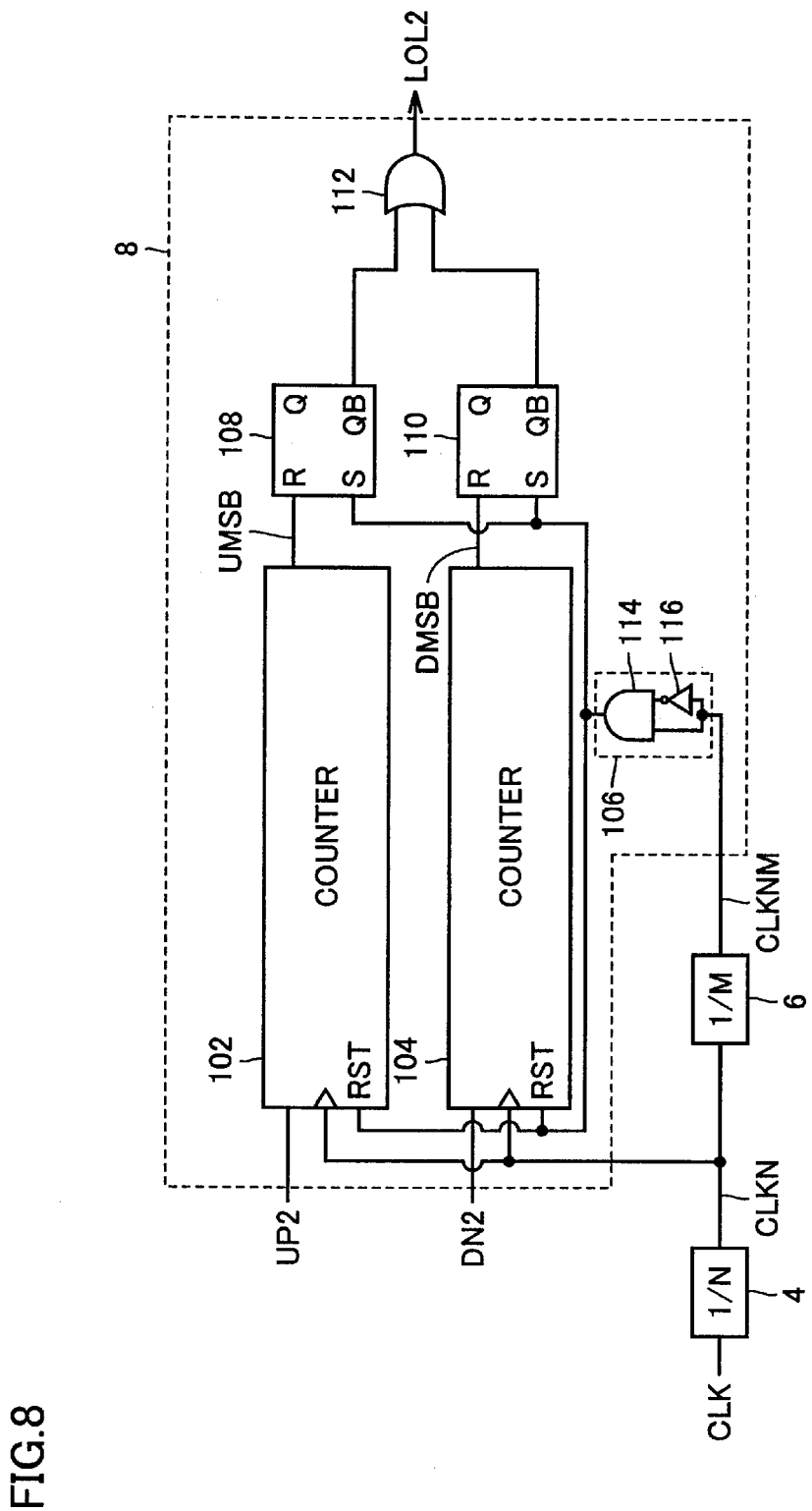
FIG. 8 is a circuit diagram showing the configuration of a counting processing unit 8 in FIG. 1.

FIG. 8 is a circuit diagram showing the configuration of counting processing unit 8 in FIG. 1.

Referring to FIG. 8, counting processing unit 8 includes a pulse generating circuit 106 for outputting a reset pulse in accordance with a change in clock signal CLKNM, a counter 102 which is reset by an output of pulse generating circuit 106 and, after that, counts the period in which control signal UP2 is at the H level in accordance with clock signal CLKN, and a counter 104 which is reset by an output of pulse generating circuit 106 and, after that, counts the period in which control signal DN2 is at the H level in accordance with clock signal CLKN. Counters 102 and 104 are, for example, n-bit binary counters.

Counting processing unit 8 further includes: an SR latch circuit 108 which is reset in response to a signal UMSB indicative of the most significant bit of counter 102 and is set in response to an output of pulse generating circuit 106; an SR latch circuit 110 which is reset in accordance with a signal DMSB indicative of the most significant bit of counter 104 and is set in accordance with an output of pulse generating circuit 106; and an OR circuit 112 for receiving signals from output QB of SR latch circuit 108 and output QB of SR latch circuit 110 and outputting an overflow detection signal LOL2. SR latch circuits 108 and 110 are latch circuits of a setting priority type.

Figure 9:
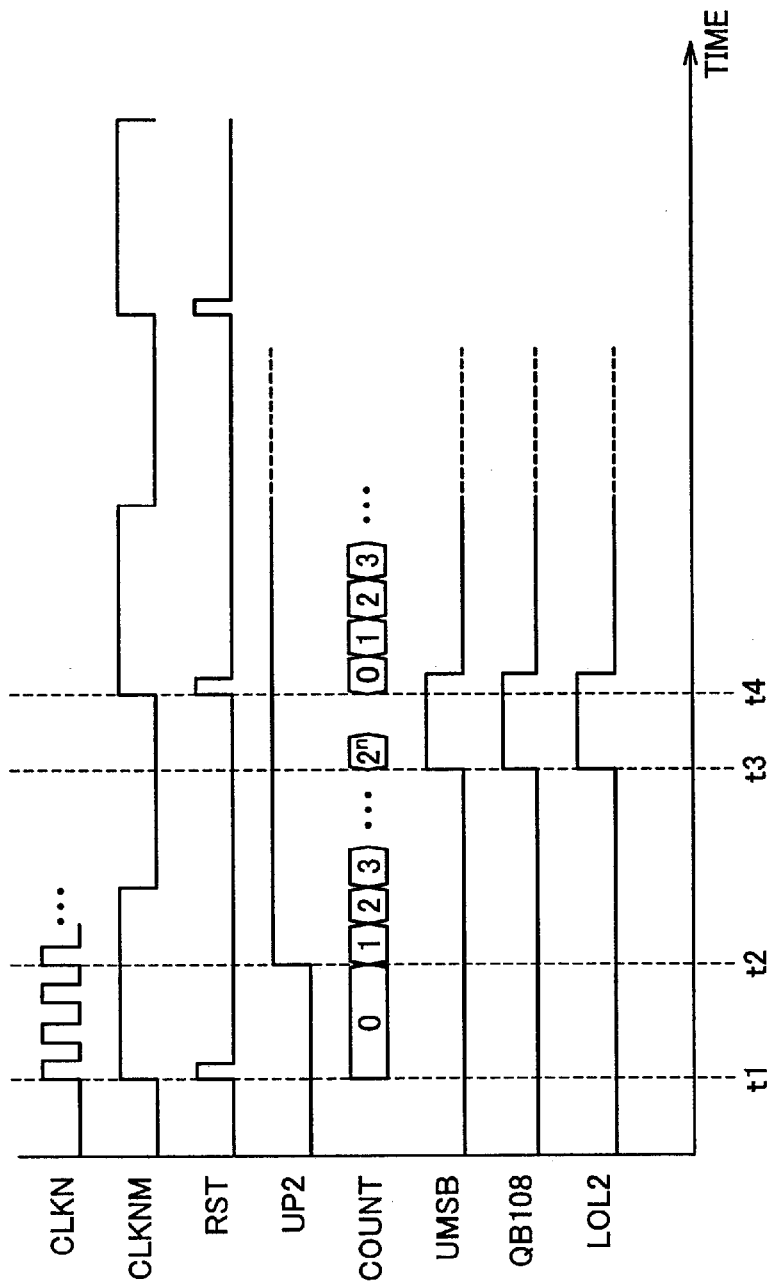
FIG. 9 is an operation waveform chart for explaining the operation of counting processing unit 8 shown in FIG. 8.

FIG. 9 is an operation waveform chart for explaining the operation of counting processing unit 8 shown in FIG. 8.

Referring to FIGS. 8 and 9, when clock signal CLKNM rises from the L level to the H level at time t1, pulse generating circuit 106 activates reset signal RST to the H level in a pulse state.

Accordingly, a count value COUNT of counter 102 is reset to 0. Since SR latch circuits 108 and 110 are set, an L-level signal is output from output QB. OR circuit 112 outputs an L-level signal as overflow detection signal LOL2.

At time t2, control signal UP2 is activated from the L level to the H level. Synchronously with clock signal CLKN, counter 102 starts counting operation to sequentially count up count value COUNT like 1, 2, 3, . . .

When count value COUNT becomes the n-th power of 2 at time t3, signal UMSB indicative of the most significant bit of counter 102 rises from the L level to the H level. Accordingly, SR latch circuit 108 is reset and a signal QB108 which is output QB of SR latch circuit 108 changes from the L level to the H level. Overflow detection signal LOL2 accordingly changes from the L level to the H level.

At time t4, simultaneously with the falling edge of clock signal CLKNM, reset signal RST is activated in a pulse state. Counters 102, 104, and SR latch circuits 108 and 110 enter again the initial state and overflow detection signal LOL2 goes low.

According to the relations of frequencies of the clock signal and data signal DATA, either control signal UP2 or DN2 is output. As shown in the conventional technique, when a data signal having large jitter is input, although the frequency of the clock signal and that of the data signal are different from each other, there is the possibility that both of control signals DN2 and UP2 are not output, or control signal DN2 is output when control signal UP2 is to be output or, on the contrary, control signal UP2 is output when control signal DN2 is to be output.

As shown in FIG. 8, therefore, control signal UP2 or DN2 is sampled simultaneously with clock signal CLKN obtained by dividing clock signal CLK to 1/N to monitor the frequency of control signal UP2 or DN2. Clock signal CLKN is further divided to 1/M to generate clock signal CLKNM, and counters 102 and 104 are periodically cleared at the edge of clock signal CLKNM. The frequency of control signal UP2 or DN2 which is output during M cycles is detected by overflow of the counter.

Although FIGS. 8 and 9 show a case where counters 102 and 104 are reset at the rising edge of clock signal CLKNM, counters 102 and 104 may be reset at the falling edge.

Overflow of the counter in the period of M cycles denotes that the output frequency of control signals input to the counter is $2^n/M$ or higher. When the output frequency of control signal UP2 or DN2 becomes $2^n/M$ or higher by the circuit shown in FIG. 8, overflow detection signal LOL2 goes high.

By setting the number of bits and the frequency division value of a clock of counters 102 and 104 to proper values, the threshold of output frequency can be set. For example, when malfunction that control signal UP2 is output often occurs, it is sufficient to increase n.

Figure 10:
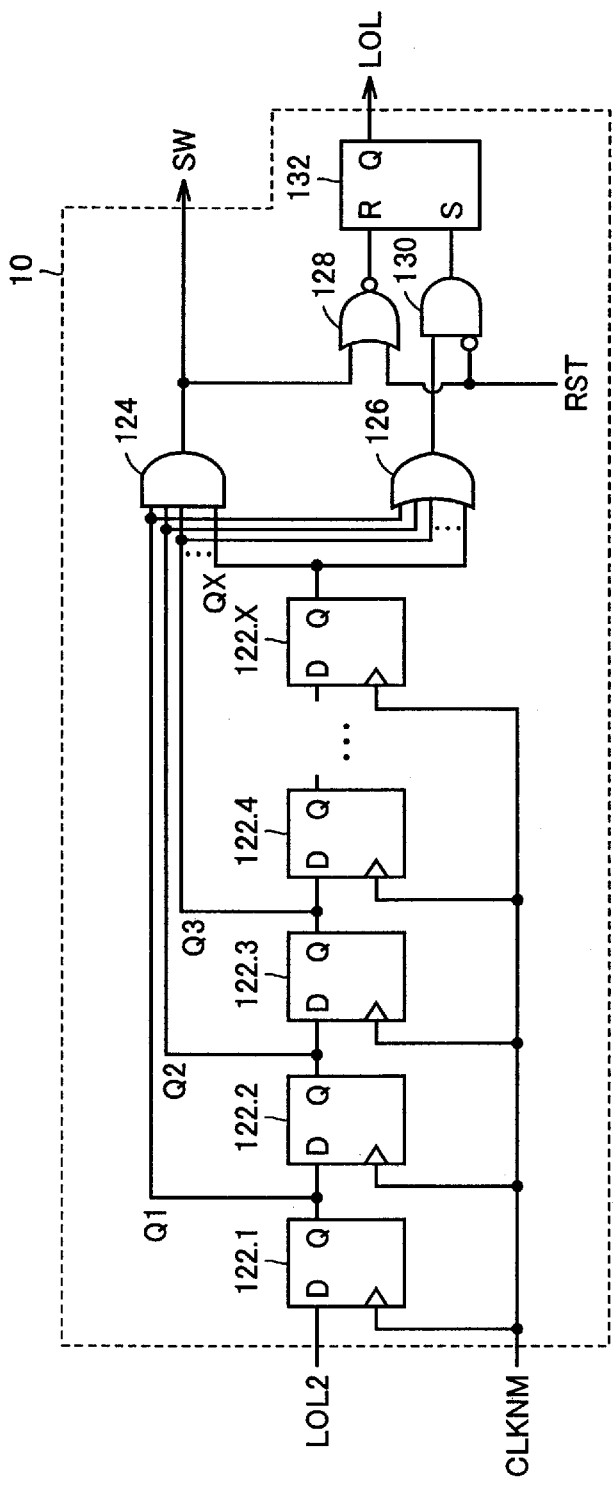
FIG. 10 is a circuit diagram showing the configuration of a hysteresis generating unit 10 in FIG. 1.

FIG. 10 is a circuit diagram showing the configuration of hysteresis generating unit 10 in FIG. 1.

Referring to FIG. 10, hysteresis generating unit 10 includes X pieces of D flip flops 122.1 to 122.X which output signals Q1 to QX, respectively, an AND circuit 124 which receives signals Q1 to QX output from D flip flops 122.1 to 122.X and outputs signal SW, and an OR circuit 126 which receives signals Q1 to QX. X pieces of D flip flops 122.1 to 122.X construct a shift register for sequentially shifting overflow detection signal LOL2 synchronously with clock signal CLKNM.

Hysteresis generating unit 10 further includes: an NOR circuit 128 which receives signal SW and an output of OR circuit 126; a gate circuit 130 for activating an output to the H level when OR circuit 126 is at the H level and reset signal RESET is at the L level; and an SR latch circuit 132 for receiving an output of NOR circuit 128 by its reset input, receiving an output of gate circuit 130 by its set input, and outputting phase-locked state detection signal LOL from its output Q.

Figures 11, 12:
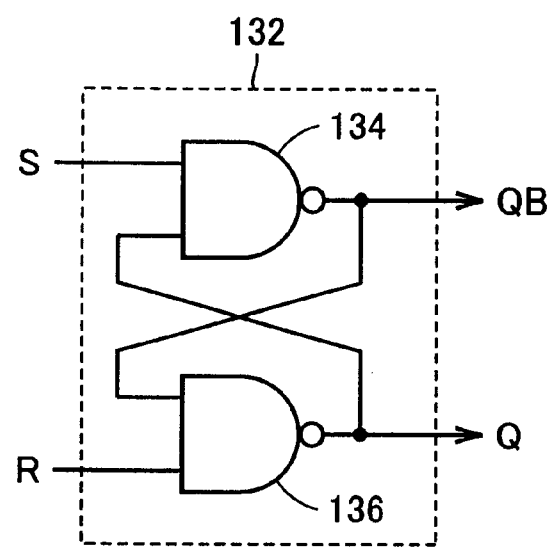
FIG. 11 is a circuit diagram showing the configuration of an SR latch circuit 132.
FIG. 12 is a diagram for explaining the operation of SR latch circuit 132.

FIG. 11 is a circuit diagram showing the configuration of SR latch circuit 132.

Referring to FIG. 11, SR latch circuit 132 includes an NAND circuit 134 which receives signals Q and S and outputs a signal QB, and an NAND circuit 136 which receives signals QB and R and outputs signal Q.

FIG. 12 is a diagram for explaining the operation of SR latch circuit 132.

Referring to FIG. 11, when both inputs S and R are at the H level, output Q maintains the previous value. When inputs S and R are at the H and L levels, respectively, output Q is at the H level. When inputs S and R are at the L and H levels, respectively, output Q is at the L level. The combination that both inputs S and R are at the L level is inhibited.

Figure 13:
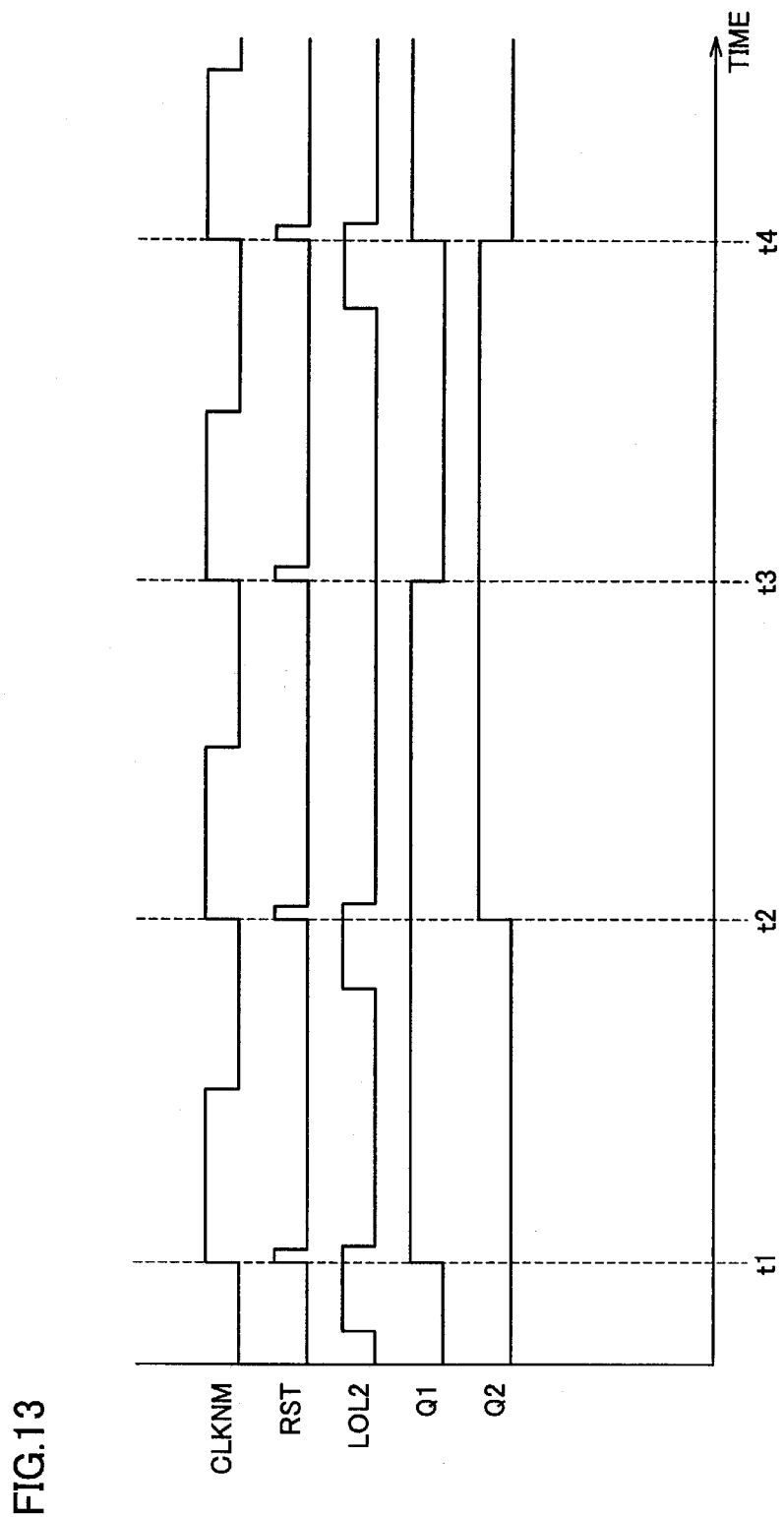
FIG. 13 is a first operation waveform chart for explaining the operation of hysteresis generating unit 10 shown in FIG. 10.

FIG. 13 is a first operation waveform chart for explaining the operation of hysteresis generating unit 10 shown in FIG. 10.

Referring to FIGS. 10 and 13, clock signal CLKNM goes high at time t1, in response to the rising edge, D flip flop 122.1 latches overflow detection signal LOL2, and signal Q1 changes from the L level to the H level. Since the H level of signal Q1 is latched by D flip flop 122.2 at time t2, signal Q2 changes from the L level to the H level at time t2. Since overflow detection signal LOL2 is at the H level at time t2, signal Q1 maintains the H level.

At time t3, as a result that overflow detection signal LOL2 is at the L level, signal Q1 changes from the H level to the L level. The change appears in signal Q2 at time t4. As described above, overflow detection signal LOL2 is latched by D flip flop 122.1, and the latched result is sequentially shifted from flip flop 122.2 to flip flop 122.X synchronously with clock signal NN.

Figure 14:
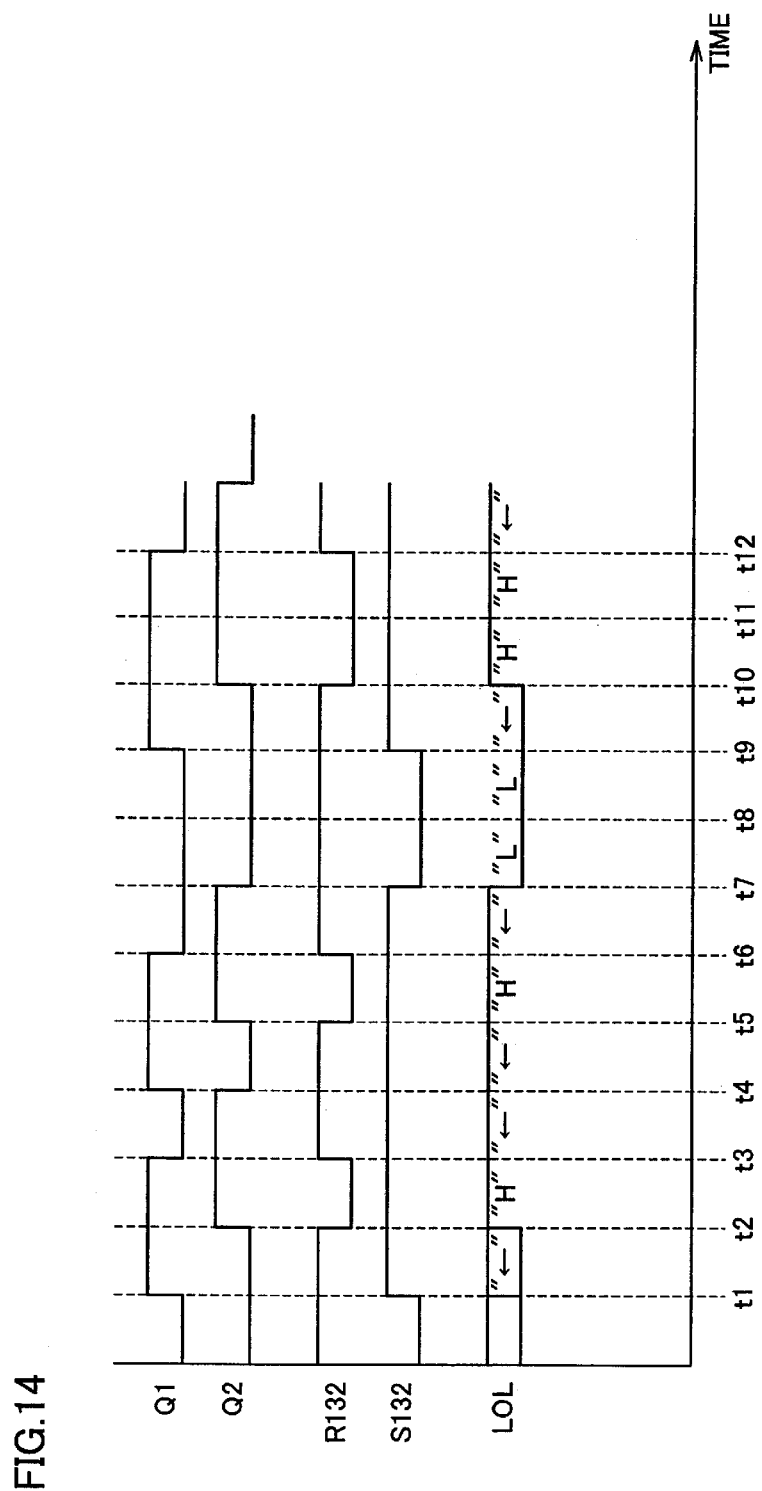
FIG. 14 is a second operation waveform chart for explaining the operation of hysteresis generating unit 10.

FIG. 14 is a second operation waveform chart for explaining the operation of hysteresis generating unit 10.

Referring to FIGS. 10 and 14, in the period from time t1 to time t2, signal Q1 is at the H level and signal Q2 is at the L level. In this case, reset signal R132 of SR latch circuit 132 is at the H level, set signal S132 is at the H level, and phase-locked state detection signal LOL maintains the previous value.

During the period from time t2 to time t3, both signals Q1 and Q2 are at the H level, accordingly, signal R132 is at the L level, and signal S132 is at the H level. As a result, signal LOL goes high.

During the period from time t3 to time t4, signal Q1 is at the L level, and signal Q2 is at the H level. In this case, both reset signal R132 and set signal S132 of SR latch circuit 132 are at the H level, and phase-locked state detection signal LOL maintains the previous value of the H level.

During the period from time t4 to time t5, signal Q1 is at the H level and signal Q2 is at the L level. In this case, both reset signal R132 and set signal S132 of SR latch circuit 132 are at the H level, and phase-locked state detection signal LOL maintains the previous value of the H level.

During the period from time t5 to time t6, both signals Q1 and Q2 are at the H level, signal R132 accordingly goes low, and signal S132 goes high. As a result, signal LOL goes high.

During the period from time t6 to time t7, signal Q1 is at the L level and signal Q2 is at the H level. In this case, both reset signal R132 and set signal S132 of SR latch circuit 132 are at the H level, and phase-locked state detection signal LOL maintains the previous value of the H level.

During the period from time t7 to time t9, both signals Q1 and Q2 are at the L level. In this case, reset signal R132 of SR latch circuit 132 is at the H level, set signal S132 is at the L level, and phase-locked state detection signal LOL is at the L level.

During the period from time t9 to time t10, signal Q1 is at the H level and signal Q2 is at the L level. In this case, reset signal R132 of SR latch circuit 132 is at the H level, set signal S132 is at the H level, and phase-locked state detection signal LOL maintains the previous value of the L level.

During the period from time t10 to time t12, both signals Q1 and Q2 go high, accordingly, signal R132 goes low, and signal S132 goes high. As a result, signal LOL goes high.

By the operations described by referring to FIGS. 13 and 14, only when overflow detection signal LOL2 goes high X times consecutively after phase-locked state detection signal LOL is set to the H level at the time of reset, it is recognized that the lock is lost, and phase-locked state detection signal LOL goes low.

In the case where the phase lock is once lost and phase-locked state detection signal LOL goes low, only after overflow detection signal LOL2 goes low X times consecutively, it is recognized that the phases are locked, and phase-locked state detection signal LOL goes high.

On the other hand, signal SW does not display such hysteresis and is set to the H level only after overflow detection signal LOL2 simply goes high X times consecutively.

Figure 15:
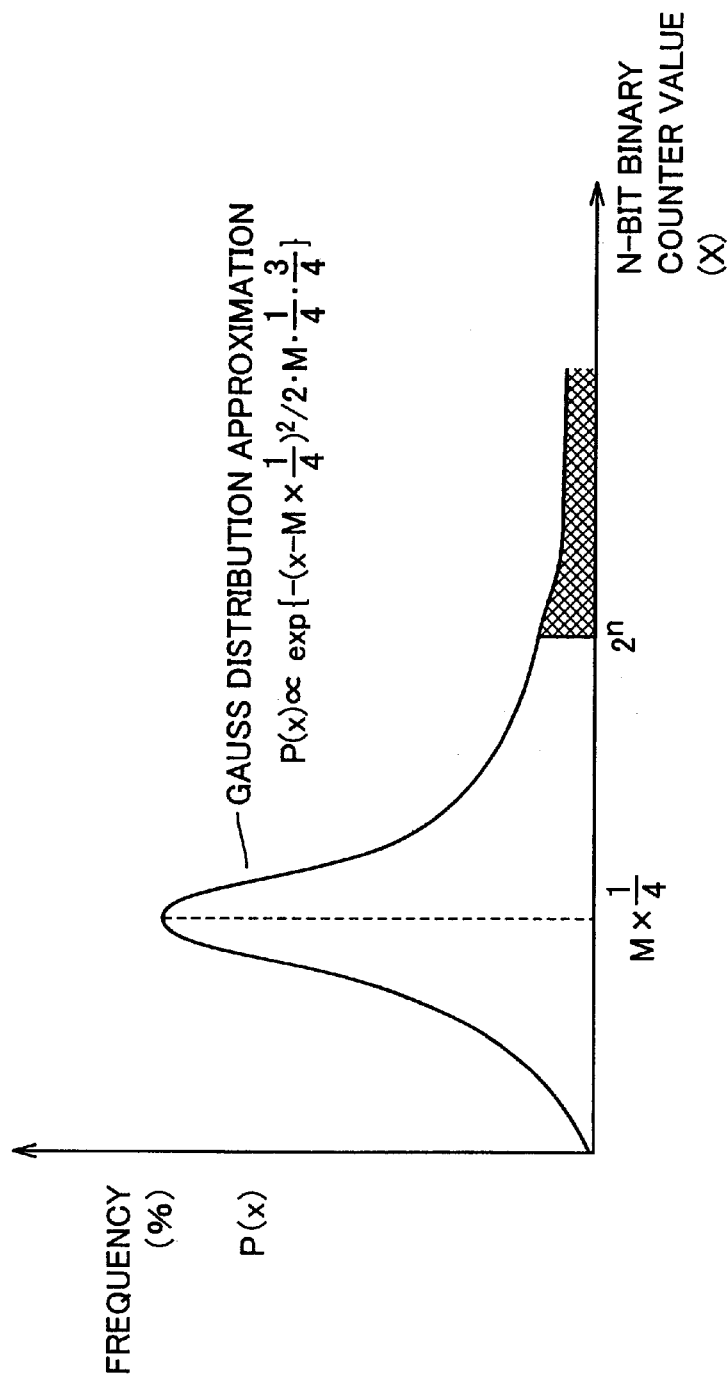
FIG. 15 is a graph schematically showing an effect of hysteresis generating unit 10.
Figure 16:
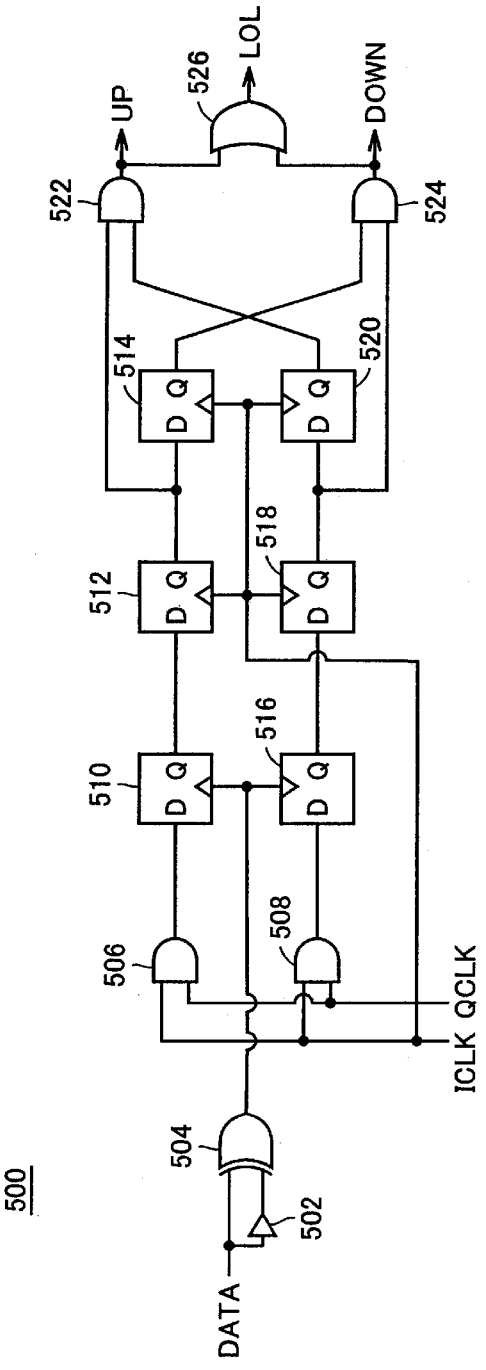
FIG. 16 is a circuit diagram showing the configuration of a conventional frequency comparator 500.
Figure 17:
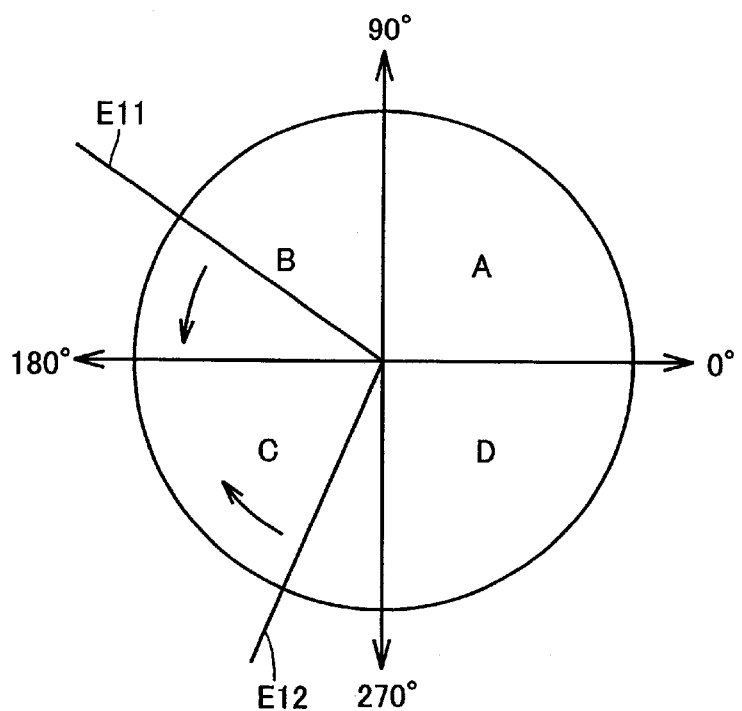
FIG. 17 is a diagram for explaining the operation of frequency comparator 500 of FIG. 16.
Figure 18:
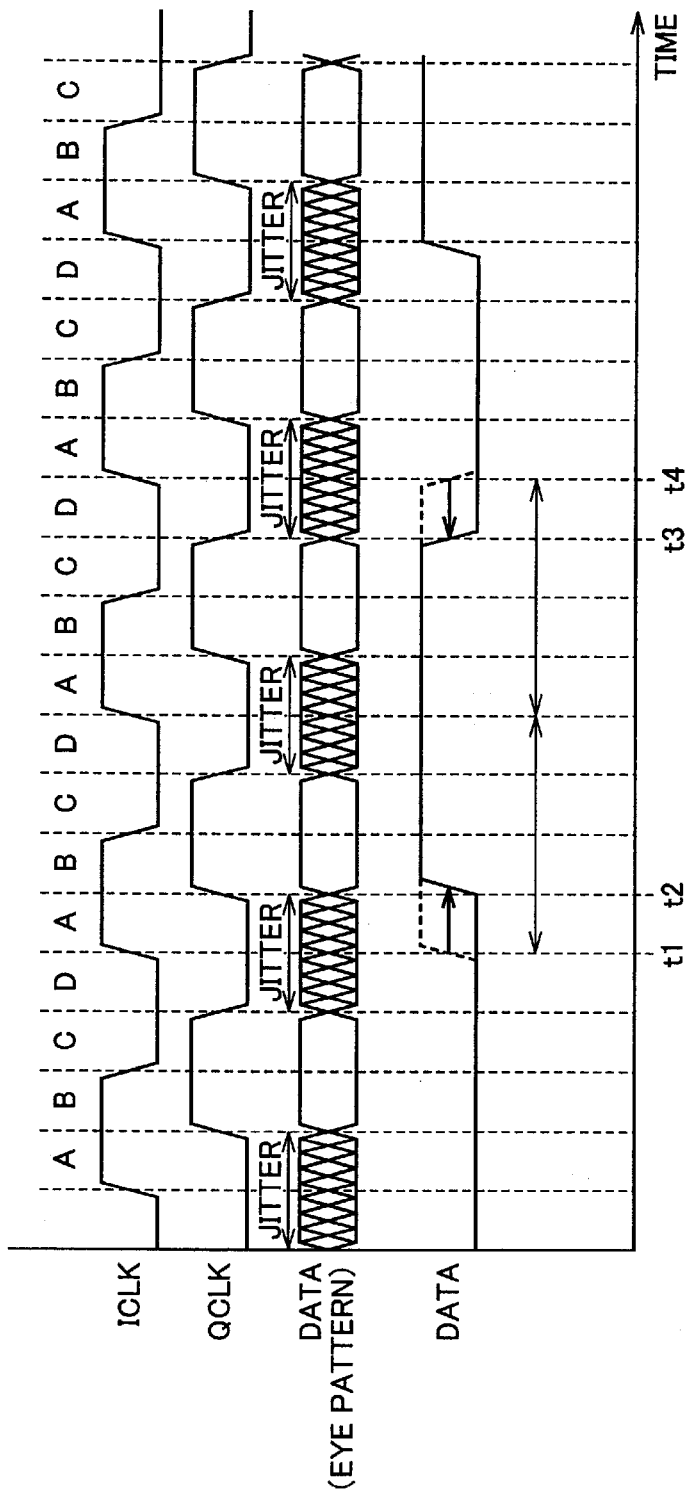
FIG. 18 is an operation waveform chart for explaining a state where jitter exists in a data signal DATA.
Figure 19:
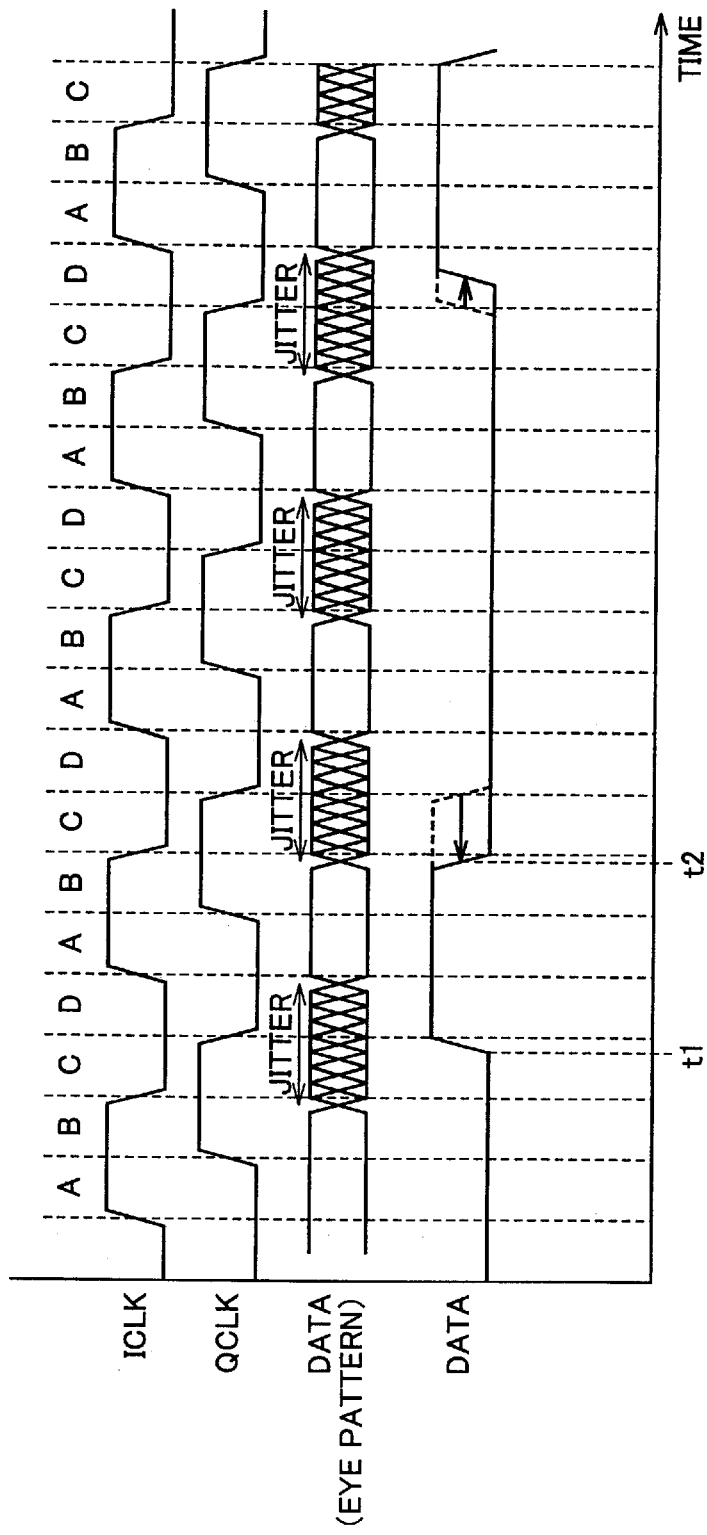
FIG. 19 is an operation waveform chart of another case of malfunction.

FIG. 15 is a diagram schematically showing the effects of hysteresis generating unit 10.

The graph of FIG. 15 shows a distribution of values obtained by sampling control signal UP2 or DN2 by n-bit binary counters 102 and 104 in M cycles. The lateral axis of the graph shows the counter value and the vertical axis indicates the frequency, in probability, that control signal UP2 or DN2 is output in the case where counter value is "x".

In the case where random data signal DATA is input to frequency comparator 2 described in FIG. 2, signals SX and SY are output quite at random. Since the frequency that signal UP2 or DN2 is output is equal to a result of computation of values held in two flip flops 84 and 88 by NOR circuits 28 and 29, it is considered that the frequency is ¼ as an average.

Therefore, in FIG. 15, the probability is the highest in the case of P(x) =M×¼. The distribution function can be approximated with the Gaussian distribution and expressed by the following expression (1).

$$P(X) \propto \exp\left(-\left(X - \frac{M}{4}\right)^2 / 2M \cdot \frac{1}{4} \cdot \frac{3}{4}\right) \quad (1)$$

where x denotes the counter value of the counter and M indicates the sample number cycle period. The probability of occurrence of overflow of m-bit binary counter 102 or 104 is expressed by the following expression (2).

$$Pov = \frac{\sum_{X=2^n}^{\infty} \exp\left(-\left(X - \frac{M}{4}\right)^2 / 2M \cdot \frac{1}{4} \cdot \frac{3}{4}\right)}{\sum_{X=0}^{\infty} \exp\left(-\left(X - \frac{M}{4}\right)^2 / 2M \cdot \frac{1}{4} \cdot \frac{3}{4}\right)} \quad (2)$$

When the cycle period M is set to 128 (=the seventh power of 2) and the number "n" of bits of the counter is 6, the probability Pov<$10^{-9}$ is obtained. Usually, the error rate of data of a device for communication is requested to be lower than $10^{-12}$. In the case of random input, overflow detection signal LOL2 goes high at the probability Pov, so that it does not satisfy the request of the error rate. Consequently, when it is set so that signal LOL changes only after overflow detection signal LOL2 is supplied k times consecutively, erroneous operation at the time of random input can be suppressed to the probability of $(10^{-9})^k$.

When it is assumed that two D flip flops 122 of hysteresis generating unit 10 are used, k=2, and it is considered that request of the error rate for communication can be sufficiently satisfied.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A frequency comparator for comparing a clock frequency with a frequency of a data signal by using first to fourth clock signals having an equal clock frequency and of which respective phases of reference edges are at 0°, 90°, 180° and 270°, comprising:

a first detector for receiving said data signal synchronously with said first and third clock signals and detecting whether or not a phase of a signal transition point of said data signal with respect to said first to fourth clock signals lies in a range from 0° to 180°;

a second detector for receiving said data signal synchronously with said second and fourth clock signals and detecting whether or not a phase of said signal transition point with respect to said first to fourth clock signals lies in a range from 90° to 270°; and a phase change detector for receiving outputs of said first and second detectors, detecting a change in the phase of said signal transition point, and outputting a result of comparison between said clock frequency and the frequency of said data signal.

2. The frequency comparator according to claim 1, wherein said first detector includes a first data latch for latching said data signal synchronously with said first and third clock signals and outputting first and second internal data signals, and a second data latch for latching said first internal data signal in accordance with said second internal data signal; and said second detector includes a third data latch for latching said data signal synchronously with said second and fourth clock signals and outputting third and fourth internal data signals, and a fourth data latch for latching said third internal data signal in accordance with said fourth internal data signal.

3. The frequency comparator according to claim 2, wherein said second data latch includes a first flip flop circuit for latching said first internal data signal at the rising edge of said second internal data signal, a second flip flop circuit for latching said first internal data signal at the falling edge of said second internal data signal, and a first phase determining unit for determining whether a phase of said signal transition point lies with respect to said clock signal in the range from 0° to 180° or not on the basis of data held in said first and second flip flop circuits; and said fourth data latch includes a third flip flop circuit for latching said third internal data signal at the rising edge of said fourth internal data signal, a fourth flip flop circuit for latching said third internal data signal at the falling edge of said fourth internal data signal, and a second phase determining unit for determining whether a phase of said signal transition point lies with respect to said clock signal in the range from 90° to 270° or not on the basis of data held in said third and fourth flip flop circuits.

4. The frequency comparator according to claim 1, wherein
said phase change detector latches an output of said first detector in accordance with an output of said second detector to compare said clock frequency with a frequency of said data signal.

5. The frequency comparator according to claim 4, wherein
said phase change detector includes
a first flip flop circuit for latching an output of said first detector at the rising edge of an output signal of said second detector,
a second flip flop circuit for latching an output of said first detector at the falling edge of an output signal of said second detector, and
an output unit for outputting said comparison result in accordance with outputs of said first and second flip flop circuits.

6. A phase-locked state detecting circuit for detecting a phase-locked state of a clock and a data signal and outputting a phase-locked state detection signal, comprising:
a frequency comparator for comparing a frequency of said clock with a frequency of said data signal, and activating a control signal when the frequencies are different from each other;
a counting processing unit for counting an activate period of said control signal per predetermined period on the basis of said clock, and outputting an overflow detection signal when a count value exceeds a predetermined number; and
a hysteresis generating unit for making said phase-locked state detection signal inactive when said overflow detection signal is activated a predetermined number of times consecutively after said phase-locked state detection signal is activated, and activating said phase-locked state detection signal when said overflow detection signal is made inactive a predetermined number of times consecutively after said phase-locked state detection signal is made inactive.

7. The phase-locked state detection circuit according to claim 6, wherein
said counting processing unit includes
a first counter for counting a period in which said control signal indicates that the frequency of said data signal is higher than that of said clock in said predetermined period,
a second counter for counting a period in which said control signal indicates that the frequency of said data signal is lower than that of said clock in said predetermined period, and
an output unit for outputting said overflow detection signal when either one of count values of said first and second counter exceeds a predetermined value in said predetermined period.

8. The phase-locked state detection circuit according to claim 6, wherein
said hysteresis generating unit includes
a shift register having a plurality of flip flops for sequentially shifting said overflow detection signal synchronously with said clock, and
a latch circuit which is set when all of data held in said plurality of flip flops is a first value and which is reset when all of data held in said plurality of flip flops is a second value that is an inversion value of said first value.

9. The phase-locked state detecting circuit according to claim 6, wherein
said frequency comparator compares said clock frequency with the frequency of a data signal by using first to fourth clock signals having an equal clock frequency and of which respective phases of reference edges are at 0°, 90°, 180° and 270°; and
said frequency comparator includes
a first detector for receiving said data signal synchronously with said first and third clock signals and detecting whether or not a phase of a signal transition point of said data signal with respect to said first to fourth clock signals lies in a range from 0° to 180°,
a second detector for receiving said data signal synchronously with said second and fourth clock signals and detecting whether or not a phase of said signal transition point with respect to said first to fourth clock signals lies in a range from 90° to 270°, and
a phase change detector for receiving outputs of said first and second detectors, detecting a change in the phase of said signal transition point, and outputting a result of comparison between said clock frequency and the frequency of said data signal.

10. The phase-locked state detecting circuit according to claim 9, wherein
said first detector includes
a first data latch for latching said data signal synchronously with said first and third clock signals and outputting first and second internal data signals, and
a second data latch for latching said first internal data signal in accordance with said second internal data signal; and
said second detector includes
a third data latch for latching said data signal synchronously with said second and fourth clock signals and outputting third and fourth internal data signals, and
a fourth data latch for latching said third internal data signal in accordance with said fourth internal data signal.

11. The phase-locked state detecting circuit according to claim 10, wherein
said second data latch includes
a first flip flop circuit for latching said first internal data signal at the rising edge of said second internal data signal,
a second flip flop circuit for latching said first internal data signal at the falling edge of said second internal data signal, and
a first phase determining unit for determining whether a phase of said signal transition point lies with respect to said clock signal in the range from 0° to 180° or not on the basis of data held in said first and second flip flop circuits; and
said fourth data latch includes
a third flip flop circuit for latching said third internal data signal at the rising edge of said fourth internal data signal,
a fourth flip flop circuit for latching said third internal data signal at the falling edge of said fourth internal data signal, and
a second phase determining unit for determining whether a phase of said signal transition point lies with respect to said clock signal in the range from 90° to 270° or not on the basis of data held in said third and fourth flip flop circuits.

12. The phase-locked state detecting circuit according to claim 9, wherein said phase change detector latches an output of said first detector in accordance with an output of said second detector to compare said clock frequency with a frequency of said data signal.

13. The phase-locked state detecting circuit according to claim 12, wherein said phase change detector includes a first flip flop circuit for latching an output of said first detector at the rising edge of an output signal of said second detector, a second flip flop circuit for latching an output of said first detector at the falling edge of an output signal of said second detector, and an output unit for outputting said comparison result in accordance with outputs of said first and second flip flop circuits.

* * * * *